United States Patent [19]

Thomas et al.

[11] Patent Number: 4,791,043

[45] Date of Patent: Dec. 13, 1988

[54] POSITIVE PHOTORESIST STRIPPING COMPOSITION

[75] Inventors: Evan G. Thomas; Edmund W. Smalley, both of East Aurora; Kane D. Cook, Buffalo, all of N.Y.

[73] Assignee: HMC Patents Holding Co., Inc., Hampton, N.H.

[21] Appl. No.: 40,710

[22] Filed: Apr. 17, 1987

Related U.S. Application Data

[63] Continuation of Ser. No. 563,336, Dec. 20, 1983, abandoned.

[51] Int. Cl.$^4$ ............................................. G03C 11/12
[52] U.S. Cl. ...................................... 430/256; 430/260; 430/329; 252/153; 252/542; 134/38
[58] Field of Search ............... 430/258, 260, 329, 331, 430/256; 252/153, 524, 542, DIG. 8; 134/38

[56] References Cited

U.S. PATENT DOCUMENTS

| | | | |
|---|---|---|---|
| 3,290,330 | 12/1966 | Fremery et al. | 260/326.8 |
| 3,355,385 | 11/1967 | Mackley | 352/104 |
| 3,455,940 | 7/1969 | Stecker | 260/295 |
| 3,597,416 | 8/1971 | Diehl | 260/212 |
| 3,629,128 | 12/1971 | Rains | 252/171 |
| 3,751,970 | 8/1973 | Alburger | 73/36 |
| 3,954,648 | 5/1976 | Belcak et al. | 252/158 |
| 3,972,839 | 8/1976 | Murphy | 252/548 |
| 4,024,085 | 5/1977 | Kobayashi et al. | 252/136 |
| 4,120,810 | 10/1978 | Palmer | 252/153 |
| 4,276,186 | 6/1981 | Bakos et al. | 252/158 |
| 4,376,069 | 3/1983 | Maggi | 252/542 |
| 4,395,479 | 7/1983 | Ward et al. | 430/258 |
| 4,401,748 | 8/1983 | Ward, Jr. et al. | 430/258 |
| 4,428,871 | 1/1984 | Ward et al. | 252/542 |

Primary Examiner—José G. Dees
Attorney, Agent, or Firm—Arthur J. Plantamura

[57] ABSTRACT

Piperazine containing positive photoresist stripping compositions are provided. Formulations include N-aminoalkylpiperazines with the formula

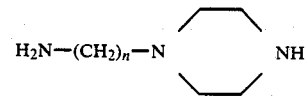

bis-N-aminoalkylpiperazines of the formula

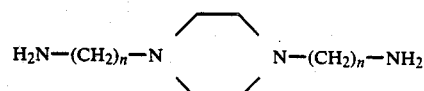

N-hydroxyalkylpiperazine of the formula

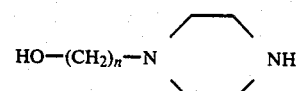

and bis-hydroxyalkypiperazines with structure

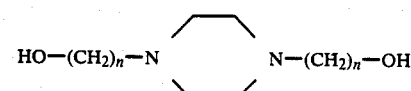

In the above formulae n=1-6. Also included are piperazine derivatives such as those of the above formulae with a branch chain alkyl of 1-6 C atoms, and 5-6 atom cycloalkyl substituted compounds wherein the cycloalkyl is substituted for $—(CH_2)_n—$. Components which may be mixed with the above described piperazine in preparing the positive photoresist stripping compositions of the invention include alkyl or cycloalkyl-2-pyrrolidones of the formula

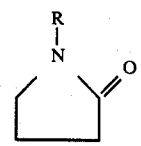

Other amide type solvents with the boiling point in excess of 200° C. as well as high boiling diethylene glycol ethers may also be incorporated.

5 Claims, No Drawings

POSITIVE PHOTORESIST STRIPPING COMPOSITION

This application is a continuation of application Ser. No. 563,336 filed Dec. 20, 1983, now abandoned.

DESCRIPTION

This invention relates to novel stripping compositions which are useful for removing positive photoresists primarily from substrates useful to integrated circuit manufacture. More particularly this invention relates to utilization of N-aminoalkylpiperazines and N-hydroxyalkylpiperazines either singly, together in admixture or diluted with certain polar solvent compositions for stripping positive photoresists.

BACKGROUND OF THE INVENTION

In the manufacture of integrated circuits and related technology, organic composition are commonly used as stripping solutions for photoresists. Both positive and negative resists are stripped using mixtures drawn from a group of substances including phenolics, sulfonic acids, chlorocarbons and hydrocarbons. Several commercially available stripping solutions are constituted in this way. Chief among disadvantages for some of these products is the toxic and skin penetrating nature of some components making handling personally hazardous and waste disposal by conventional dumping and landfill procedures undesirable. The inclusion of hydroscopic sulfonic acid components tends to cause water absorption that leads to corrosivity toward semiconductor substrate metals. Reaction between aluminum metal and chlorocarbon can yield low levels of chloride on substrate surfaces which in turn translates into device damage through corrosion.

When photolithography device manufacture involves only positive photoresists, stripping may be done with a number of organic mixtures comprised of any of a number of polar solvents and mixtures of solvents. An indication of this is described by W. S. DeForest (Photoresist: Materials and Processes, McGraw-Hill, Inc. 1975). Some of these stripping compositions include dimethylformamide, N-methyl-2-pyrrolidone diethanolamine, triethanolamine, several glycol ethers (e.g., such as those available commercially under the brand names Cellosolv and Carbitol), and ketones (i.e. methylethylketone, acetone, methylisobutylketone, cyclohexanone). A number of stripping solutions currently on the market utilize mixtures of some of these organic solvents and are designed for use exclusively in removing positive resists.

The difficulty of photoresist stripping depends on process conditions used in device manufacture which may be determined by the type of device made. When most positive resists are cured by baking no higher than 150° C., removal using most solvent based stripping solutions is achieved at relatively low temperatures near normal room temperature. With bake temperatures between 150° and 200° C. photoresist stripping is more difficult and may require using higher temperatures for the stripping process. Where photoresist films or patterns are exposed to plasma and ion implantation conditions during dry processing, very hard to strip material is formed.

From experience with available stripping solutions, it has been found that mixtures comprised of "neutral" polar solvents such as amides (DMF, N-methyl-2-pyrrolidone, etc.) glycol ethers (Cellosolv, Carbitols, etc.) sulfones (e.g., sulfolanes), ketones (e.g., acetone, methylethylketones and the like) are practical for stripping easy to remove (not baked or baked at 135° C. maximum) positive photoresists. For positive photoresists baked higher than 150° or exposed to plasma or ion implantation processing, it is often advantageous to use stripping solutions consisting of amines or amines diluted with neutral polar solvents.

It is desirable to operate photoresist stripping at low temperatures primarily for safety reasons minimizing both fire hazards from solvent fumes and contacting personnel with hot liquids and vapors. Lower temperature operation also minimizes problems from changing composition due to selective vaporization of more volatile components.

One of the major drawbacks in stripping solutions which are effective for vary hard to strip material is that they usually contain environmentally hazardous or toxic ingredients such as phenolics or chlorinated hydrocarbons. Accordingly, a need exits for an improved environmentally safe, relatively non-toxic positive photoresist stripping composition which is effective in removing hard to strip positive photoresists.

SUMMARY OF THE INVENTION

The invention involves the use of substituted piperazines alone or diluted with certain polar solvents as stripping solutions for use on positive photoresist compositions. Using mixtures of these components allows overcoming of many problems associated with resist stripping. Components are relatively non-toxic allowing minimized hazards in use areas. For application with resists cured by thermal bake stripping at relatively low temperature (room temperature to 70° C.) is practical. Components are sufficiently high boiling to allow high temperature operation when necessary to strip more difficult photoresist residues (i.e., plasma exposed and ion implant exposed photoresist). To that end adjustment in the composition is possible to allow for synergistic action between piperazine derived components. The stripping compositions of the present invention include N-aminoalkylpiperazines of the formula

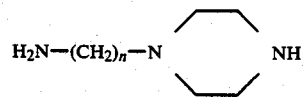

bis-N-aminoalkylpiperazines of the formula

N-hydroxyalkylpiperazine of the formula

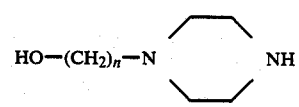

and bis-hydroxyalkypiperazines with structure

In the above formulae n=1—6. Also included are piperazine derivatives such as those of the above formulae with a branch chain alkyl of 1–6 C atoms, and 5–6 C atom cycloalkyl substituted compounds wherein the cycloalkyl is substituted for —(CH$_2$)$_n$—. Components which may be mixed with the above described piperazines in preparing the positive photoresist stripping compositions of the invention include alkyl- or cycloalkyl-2-pyrrolidones of the formula

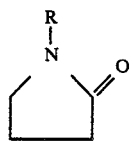

where R is an alkyl group of 1–6 carbon atoms or 5 or 6 member cycloalkyl, and also aminoalkyl and including hydroxyalkyl of 1–6 carbon atoms. Other amide type solvents with a boiling point in excess of 200° C. e.g., N-formylmorpholine, may also be incorporated in amounts of up to about 70 percent by weight. The stripping mixtures may also include glycol ethers having boiling points exceeding 200° C., e.g., monoethyl, monobutyl, or monohexyl ethers of diethylene glycol.

The respective components in the stripping compositions of the invention comprise N-aminoalkylpiperazine in a range between 0% and 90% by weight; N-hydroxyalkylpiperazine between 0% and 90% by weight provided that at least one of said piperazines is present in amounts of at least 10% by weight; N-methyl-2-pyrrolidone between 0% and 90% by weight and diethylene glycol monobutyl ether between 0% and 25% by weight. Preferred compositions for general application comprise between 2% and 15% by weight N-hydroxyalkylpiperazine, 10–30% by weight N-aminoalkylpiperazine, 0–20% by weight diethylene glycol monobutyl ether and 70–80% by weight N-methyl-2-pyrrolidone;

DESCRIPTION OF THE PREFERRED EMBODIMENT

The novel stripping compositions comprising the subject matter of the present invention which are useful for removing positive photoresists primarily from substrates useful to integrated circuit manufacture utilize N-aminoalkylpiperazines and N-hydroxyalkylpiperazines either singly or together in admixture or diluted with certain polar solvent compositions. Phenolics and chlorinated hydrocarbon compounds are excluded giving low toxicity and minimized waste disposal problems.

The substituted piperazines may be used alone or diluted with certain polar solvents as stripping solutions for positive photoresists. Using mixtures of these components allows overcoming of problems associated with resist stripping. And because the components used are relatively non-toxic, they present minimized hazards in the work areas. For application with resists cured by thermal bake stripping at relatively low temperature (room temperature to 70° C.) is practical. Components are sufficiently high boiling to allow high temperature operation when necessary to strip more difficult photoresist residues (i.e., plasma exposed and ion implant exposed photoresist) with considerable adjustment possible in the composition to allow for optimum stripping action between piperazine derived components.

Included in the stripping compositions of this invention are the N-aminoalkylpiperazines of the formula:

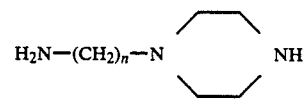

bis N-aminoalkylpiperazines of the formula

N-hydroxyalkylpiperazine of the formula

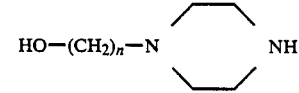

and bis-hydroxyalkypiperazines with structure

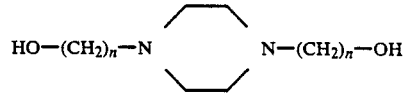

In the above formulae n=1–6. Also included are piperazine derivatives such as those of the above formulae with a branch chain alkyl of 1–6 C atoms, and 5–6 C atom cycloalkyl substituted compounds wherein the cycloalkyl is substituted for —(CH$_2$)$_n$—. Components which may be mixed with the above described piperazine in preparing the positive photoresist stripping compositions of the invention include alkyl or cycloalkyl-2-pyrrolidones of the formula

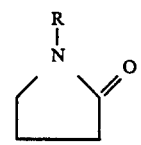

where R is an alkyl group of 1–6 carbon atoms or a 5 or 6 member cycloalkyl and including aminoalkyl and hydroxyalkyl of 1–6 carbon atoms. Other amide type solvents with a boiling point in excess of 200° C. may also be incorporated into the stripping compositions, for example, N-formylmorpholine and other polar organic compounds that are compatible with the above piperazines e.g., glycol ethers having boiling points exceeding 200° C. (such as monoethyl, monobutyl, or monohexyl ethers of diethylene glycol) in amounts of up to about 70% by weight. The proportions of components in the piperazine containing stripper may vary within fairly broad limits, providing that at least one of the piperazines is present in an amount of at least 10% by weight, and include N-aminoethylpiperazine (NAEP) in a range between 0% and 90% by weight; N-hydroxyethyl piperazine (NHEP) between 0% and 90% by weight. Other components, e.g., N-methyl-2-pyrrolidone (NMP) may be incorporated in amounts of between 5% and 90% by weight; and butylcarbitol (BC) in amounts between 0% and 25% by weight. Preferred compositions for general application comprise combinations of hydroxyalkylpiperazines, especially hydroxyethylpiperazine and aminoalkyl, piperazines, especially aminoethylpiperazine in the range by weight of 10%-30% by weight N-aminoethylpiperazine, 2%-15% by weight N-hydroxyethylpiperazine, and 70%-80% by weight N-methyl-2-pyrrolidone.

The invention will be further described by the following specific examples. It should be understood, however, that although these examples may describe in detail certain preferred operating conditions of the invention, they are given primarily for purposes of illustration, and the invention in its broader aspects is not limited thereto. Parts expressed are parts by weight unless otherwise stated.

GENERAL PROCEDURE

In preparing the stripping compositions of the invention, no particular order of addition need be employed. The various components are measured in the desired proportion and introduced into a suitable mixing vessel and thoroughly mixed by stirring. Any alternate suitable means to effectively intermix the components such as by concurrent introduction of streams of the respective components, or any other suitable known means that fully intersperse the components may be used. Once mixed, the stripping composition is stable, with no detectable separation of components and has excellent shelf life.

The photoresist compositions employed are any of the commercially available organic photosensitizer alkaline soluble resin formulations which comprise (a) a suitable sensitizer such as diazo ketone compounds, e.g., naphthaquinone-1, 2-diazo sulfonic acid esters, (b) a novalak resin and (c) a suitable solvent such as xylene. Photoresists are generally described, for example, on page 67 in the work by D. J. Elliot in Integrated Circuit Fabrication Technology, McGraw-Hill Book Company, 1982.

EXAMPLES 1-6

Table 1 summarizes examples 1-6 showing comparative results in stripping 1μ thick, non-patterned films of commercially available resist (Shipley 1470) prebaked at 90° C. followed by final hard bake at 135° C. and 200° C. each for 30 minutes. The stripping method involved soaking coated wafers in a temperature controlled tank of stripping solution. The stripped wafers are rinsed in copious amounts of deionized water. After air drying completeness of strip was judged by visual inspection with and without moisture film deposition. From these examples, using compositions claimed by the present invention, the following attributes are noted:

(a) Fast stripping of high temperature (200° C.) baked resist can be accomplished at relatively low operating temperature.

(b) Suitable fast stripping rates of resists baked up to 135° C. can be effected by room temperature stripping.

TABLE I

| STRIPPING THERMALLY CURED POSITIVE RESIST | | | |
|---|---|---|---|
| Example | Stripper Composition | 70° C. Strip 200° C. Bake | Room Temp. (25° C.) Strip 135° C. Bake |
| (1) | 70% NMP 30% NAEP | 4.5 min. | 3.5 min. |
| (2) | 10% NMP 90% (6/1-NAEP/NHEP) | 36 min. | 7.3 min. |
| (3) | 70% BC 30% NAEP | 36 min. | 30 min. |
| (4) | 70% NMP 30% (6/1-NAEP/NHEP) | 4 min. | 3 min. |
| (5) | 70% NMP 30% (2/1-NAEP/NHEP | 3.7 min. | 3 min. |
| (6) | 70% NMP 30% NHEP | 1.5 min. | 2.25 min. |

EXAMPLES 7-10

Examples 7-10 employed the same stripping method described with reference to Examples 1-6 except resist patterns were stripped at 150° C. and evaluated visually at 100 magnification; the results are summarized in Table II. These examples in a relative way demonstrate the following:

(a) Stripping plasma and ion implant exposed photoresist requires relatively high stripping temperatures.

(b) Synergistic effects are indicated among the three components. Examples 9, 11 and 12 show a region in plasma stripping of constant NAEP/NHEP ratio with a maximum stripping rate in the vicinity of 12% NMP. Examples 7, 9 and 10 suggest a maximum stripping rate in ion implant stripping over a range of NAEP/NHEP ratios.

(c) Effectiveness for stripping boron ion implanted wafers occurs with different mixtures than those effective with plasma exposed resist.

TABLE II

| HIGH ENERGY EXPOSED | | | |
|---|---|---|---|
| Example | Stripper Composition | $CF_4/O_2$ Plasma | Boron Ion Implant |
| (7) | NAEP 76 NHEP 12 NMP 12 | 60% stripped 60 min. | 100% stripped 60 min. |
| (8) | NAEP 81 NHEP 14 NMP 5 | 30% stripped 60 min. | 40% stripped 60 min. |
| (9) | NAEP 70 NHEP 18 NMP 12 | 90% stripped 60 min. | 40% stripped 60 min. |
| (10) | NAEP 58 NHEP 30 NMP 12 | 80% stripped 60 min. | 35% stripped 60 min. |
| (11) | NAEP 76 NHEP 19 NMP 5 | 15% stripped 60 min. | 30% stripped 60 min. |
| (12) | NAEP 64 NHEP 16 NMP 20 | 30% stripped 60 min. | 35% stripped 60 min. |

The positive photoresist stripping composition of the invention allows operation at relatively low temperatures which is advantageous for safety reasons and especially because lower temperatures minimize the fire hazard from solvent fumes which would pose a greater danger to personnel when hot liquids and vapors are present. Additionally, the lower temperature substantially facilitates renewal of the stripping solutions during operations. Also, operation at lower temperatures reduces vaporization which can lead to an objectionable change in the stripping solution composition.

It will be understood that considerable variation in the conditions and materials may be made within the dislosure provided herein and, therefore, it is not intended that the invention be limited except as set forth in the claims.

What is claimed is:

1. A stripping composition for removing an organic positive photoresist composition from the surface of a semiconductor substrate containing such photoresist comprising (a) N-amino-alkylpiperazine in a range between 0% and 90% by weight; N-hydroxyalkyl-piperazine between 0% and 90% by weight provided that at least one of said piperazines is present in an amount of at least 10% by weight, and (b) between 5% and 90% by weight of a pyrrolidone selected from the group consisting of alkyl or cycloalkyl-2-pyrrolidones of the formula

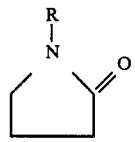

where R is an alkyl group of 1-6 carbon atoms or a 5 or 6 member cycloalkyl and including aminoalkyl and hydroxyalkyl of 1-6 carbon atoms.

2. The stripping composition of claim 1, wherein the (b) component comprises N-methyl-2-pyrrolidone.

3. The stripping composition of claim 1, wherein (a) comprises a blend of N-aminoethylpiperazine and N-hydroxyethylpiperazine in a ratio respectively of 1:1 to about 10:1 in an amount of about 30 percent by weight and (b) comprises N-methyl-2-pyrrolidone in an amount of about 70 percent by weight.

4. The stripping composition of claim 1, comprising between 2% and 15% by weight N-hyroxyalkylpiperazine, 10-30% by weight N-aminoalkylpiperazine, 0-20% by weight diethylene glycol monobutyl ether and 70-80% by weight N-methyl-2-pyrrolidone;

5. A method of stripping positive photoresist from a substrate semiconductor surface having a layer of said photoresist applied thereon comprising contacting the photoresist layer with the composition of claim 1, at a temperature between about 15° C. and about 160° C. until said photoresist is substantially removed.

* * * * *